United States Patent
Salit

(10) Patent No.: US 10,371,763 B2
(45) Date of Patent: Aug. 6, 2019

(54) SYSTEMS AND METHODS FOR LOW POWER MAGNETIC FIELD GENERATION FOR ATOMIC SENSORS USING ELECTRO-PERMANENT MAGNETS

(71) Applicant: Honeywell International Inc., Morristown, NJ (US)

(72) Inventor: Kenneth Salit, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1054 days.

(21) Appl. No.: 14/802,818

(22) Filed: Jul. 17, 2015

(65) Prior Publication Data
US 2017/0016968 A1 Jan. 19, 2017

(51) Int. Cl.
| | | |
|---|---|---|
| G01R 33/24 | (2006.01) | |
| G01R 33/26 | (2006.01) | |
| G01R 33/383 | (2006.01) | |
| G01R 33/389 | (2006.01) | |
| H01F 7/02 | (2006.01) | |
| H01F 13/00 | (2006.01) | |
| G01C 19/58 | (2006.01) | |
| G01C 19/62 | (2006.01) | |
| G04F 5/14 | (2006.01) | |
| G21K 1/00 | (2006.01) | |

(52) U.S. Cl.
CPC ............ *G01R 33/24* (2013.01); *G01R 33/26* (2013.01); *G01R 33/383* (2013.01); *H01F 7/0273* (2013.01); *H01F 7/0284* (2013.01); *G01C 19/58* (2013.01); *G01C 19/62* (2013.01); *G01R 33/389* (2013.01); *G04F 5/14* (2013.01); *G21K 1/006* (2013.01); *H01F 13/00* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 7,709,807 B2 * | 5/2010 | McClelland | ............ | H01J 27/24 250/423 P |
| 7,915,577 B2 * | 3/2011 | Fatemi | ..................... | H05H 3/04 250/251 |
| 8,054,073 B2 * | 11/2011 | Tuchman | ............. | G01R 33/032 324/301 |

(Continued)

OTHER PUBLICATIONS

Sabulsky et al, "Efficient contionuous-duty Bitter-type electromagnets for cold atom experiments", "Review of Scientific Instruments", Oct. 28, 2013, pp. 104706-1 to 104706-5.

(Continued)

*Primary Examiner* — Melissa J Koval
*Assistant Examiner* — Tiffany A Fetzner
(74) *Attorney, Agent, or Firm* — Fogg & Powers LLC

(57) ABSTRACT

Systems and methods for low power magnetic field generation for atomic sensors using electro-permanent magnets are provided. In one embodiment, a method for magnetic field generation for an atomic sensor comprises: laser cooling a sample of atoms in a chamber; and trapping the sample of atoms in a magneto-optical trap within the chamber by applying an atom trapping field across the sample of atoms using at least one pair of electro-permanent magnet units.

18 Claims, 7 Drawing Sheets

(56) References Cited

U.S. PATENT DOCUMENTS

| | | | | |
|---|---|---|---|---|
| 8,289,018 | B2* | 10/2012 | Narducci | G01R 33/022 250/251 |
| 8,310,230 | B2* | 11/2012 | Haensch | G01R 33/1284 324/228 |
| 8,760,159 | B2* | 6/2014 | Tuchman | G01R 33/032 324/304 |
| 8,803,072 | B2* | 8/2014 | Booth | C23C 14/221 250/251 |
| 8,835,833 | B2 | 9/2014 | Du et al. | |
| 9,121,889 | B2* | 9/2015 | Tuchman | G01R 33/032 |
| 2002/0134931 | A1 | 9/2002 | Hirano et al. | |
| 2008/0296483 | A1* | 12/2008 | McClelland | H01J 27/24 250/251 |
| 2009/0272887 | A1* | 11/2009 | Fatemi | G01R 33/1284 250/251 |
| 2009/0289629 | A1* | 11/2009 | Tuchman | G01R 33/032 324/304 |
| 2011/0101972 | A1* | 5/2011 | Narducci | G01R 33/022 324/244 |
| 2011/0234219 | A1* | 9/2011 | Boehi | G01R 33/10 324/260 |
| 2011/0279115 | A1* | 11/2011 | Tuchman | G01R 33/032 324/301 |
| 2011/0290991 | A1* | 12/2011 | Booth | C23C 14/221 250/251 |
| 2014/0111198 | A1* | 4/2014 | Tuchman | G01R 33/032 324/301 |
| 2015/0001382 | A1 | 1/2015 | Imhof et al. | |
| 2017/0016968 | A1* | 1/2017 | Salit | G01R 33/26 |

OTHER PUBLICATIONS

European Patent Office, "European Search Report for EP Application No. 16179072.0", "from U.S. Appl. No. 14/802,818", dated Dec. 9, 2016, pp. 1-9, Published in: EP.

Fauquembergue et al., "Partially Ferromagnetic Electromagnetic for Trapping and Cooling Neutral Atoms to Quantum Degeneracy", "ARXIV.org, Cornell University Library, 201 Olin Library Cornell University Ithaca, NY 14853", Jul. 6, 2005, pp. 1-8, vol. XP080200289.

Lewandowski et al., "Simplified System for Creating a Bose-Einstein Condensate", "Journal of Low Temperature Physics, http://jila.colorado.edu/bec/CornellGroup/JLTP_Lewandowski2003.pdf", Sep. 1, 2003, pp. 309-367.

Makoto Morinaga, "A Ring Magneto-Optical Trap", "Quantum Electronics Conference, 2005. International Jul. 11, 2005, Piscathaway, NJ, USA IEEE", Jul. 11, 2005, pp. 681-682, vol. XP010865814, Published in: US.

* cited by examiner

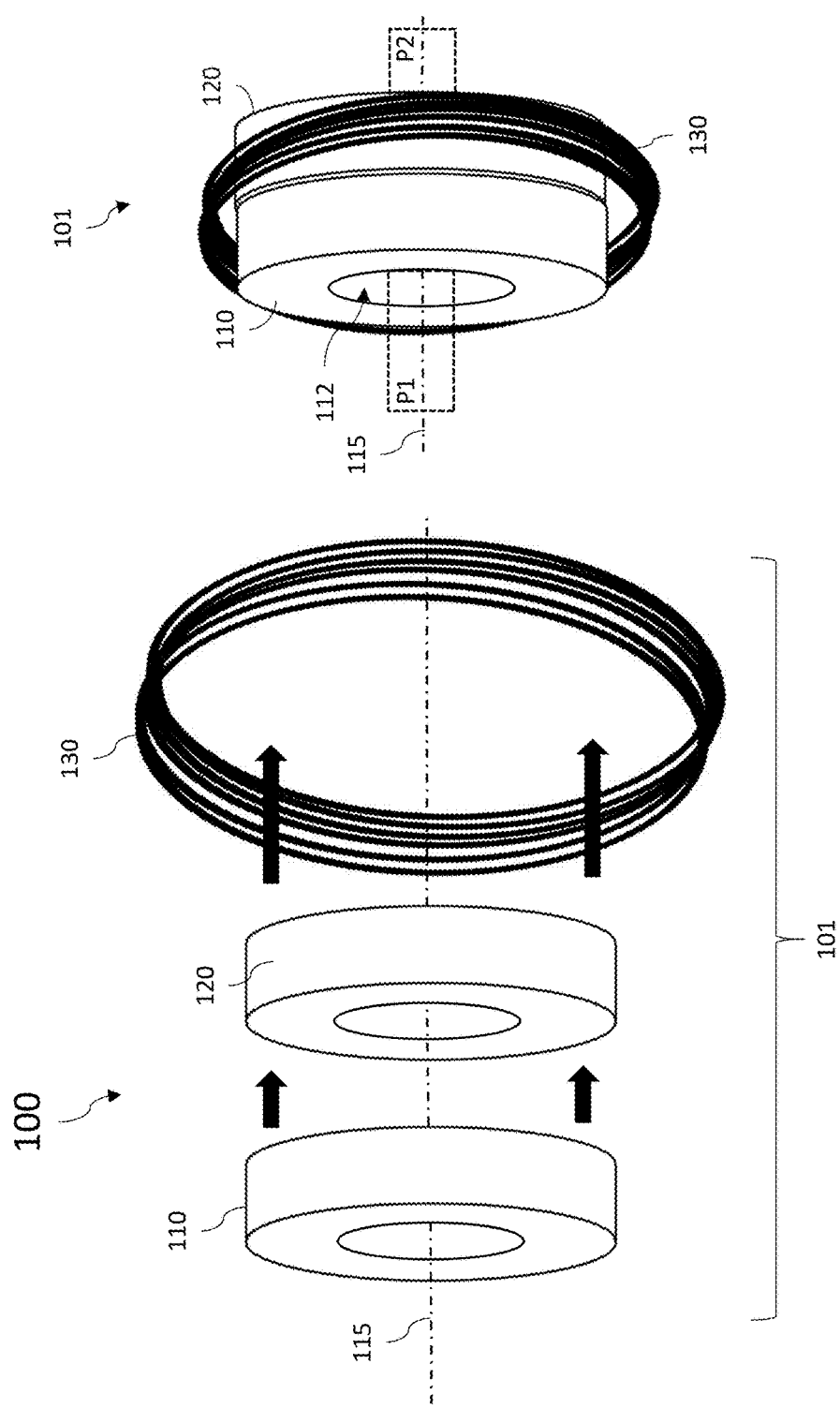

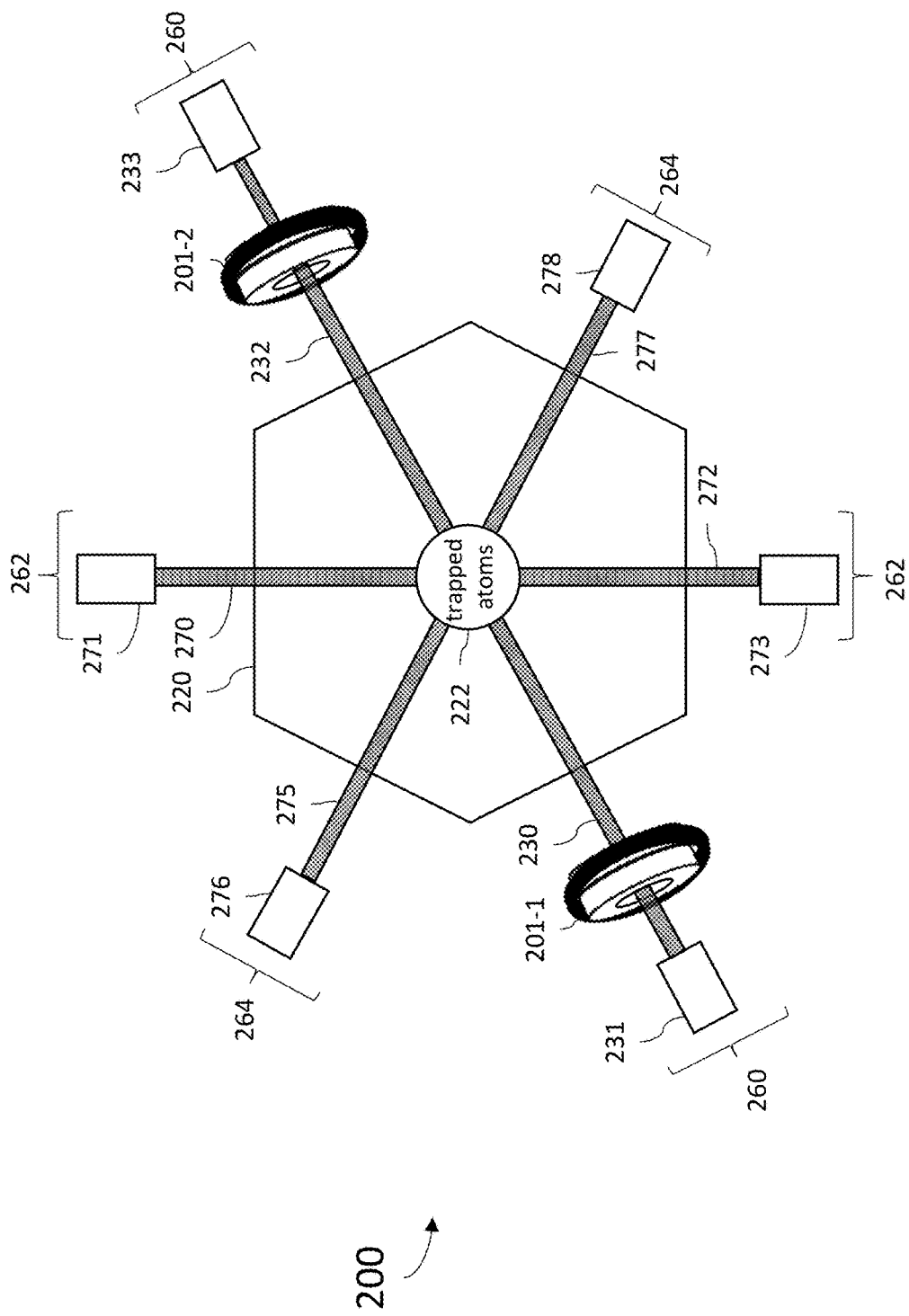

SYSTEMS AND METHODS FOR LOW POWER MAGNETIC FIELD GENERATION FOR ATOMIC SENSORS USING ELECTRO-PERMANENT MAGNETS

BACKGROUND

In industry today, there is a continuing need to develop increasingly small sensors that can run with very low power consumption. Cold atom sensors represent one developing technology that have the potential to satisfy both the size and power needs for such small sensors such as highly stable miniature atomic clocks and high performance inertial measurement systems. Cold atom sensors operate by laser cooling and trapping of atoms. An anti-Helmholtz magnetic field can then be applied in order create a trapping potential, the minimum of which defines the center of the trap. The anti-Helmholtz field profile is usually produced by electromagnetic coils where electric current to the coils can be switched on and off during the measurement cycle. However, these electro-magnetic coils can consume large amounts of power in a cold atom sensor. This configuration requires the coils to remain energized to maintain the atom trap, and then momentarily turned off so that the trapped atoms can be probed to obtain measurements.

For the reasons stated above and for other reasons stated below which will become apparent to those skilled in the art upon reading and understanding the specification, there is a need in the art for alternate systems and methods for providing low power magnetic field generation for atomic sensors.

SUMMARY

The Embodiments of the present invention provide methods and systems for providing low power magnetic field generation for atomic sensors and will be understood by reading and studying the following specification.

Systems and methods for switchable low power magnetic field generation for atomic sensors using electro-permanent magnets are provided. In one embodiment, a method for magnetic field generation for an atomic sensor comprises: laser cooling a sample of atoms in a chamber; and trapping the sample of atoms in a magneto-optical trap within the chamber by applying an atom trapping field across the sample of atoms using at least one pair of electro-permanent magnet units.

DRAWINGS

Embodiments of the present invention can be more easily understood and further advantages and uses thereof more readily apparent, when considered in view of the description of the preferred embodiments and the following figures in which:

FIGS. 1 and 1A are diagrams of an electro-permanent magnet unit of one embodiment of the present disclosure;

FIGS. 2, 2A, 2B and 2C are diagrams of a cold atom sensor of one embodiment of the present disclosure.

In accordance with common practice, the various described features are not drawn to scale but are drawn to emphasize features relevant to the present invention. Reference characters denote like elements throughout figures and text.

DETAILED DESCRIPTION

Figure 1B:
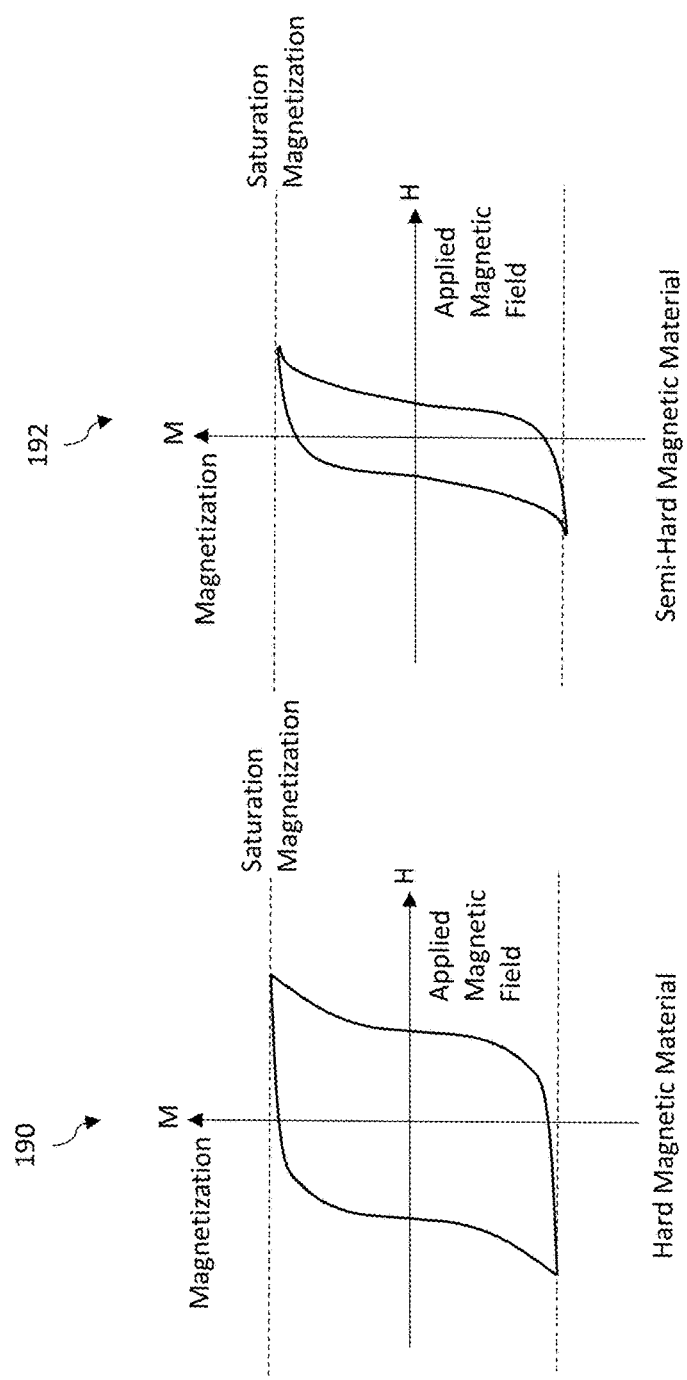
FIG. 1B are magnetic hysteresis diagrams illustrating hard verses semi-hard magnetic material of an electro-permanent magnet unit of one embodiment of the present disclosure.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure provide system and methods for producing a switchable anti-Helmholtz-like field for cold atomic sensors that exhibit relatively low power consumption by utilizing electro-permanent magnets. As the term is used herein, an electro-permanent magnet unit refers to an assembly of magnetic materials that each possess a permanent inherit magnetism and produce magnetic fields without external stimulus (i.e., as opposed to an electromagnet which requires application of an electric current into a coil to produce a magnetic field). However, the polarity of the magnetic fields produced by at least one of the magnetic materials in an electro-permanent magnet unit may be altered by exposing that magnetic material to an external magnetic field of sufficient strength. As explained below, electro-permanent magnet units are arranged in pairs to create a magnetic gradient in the center of a vacuum chamber or other vessel in conjunction with a pair of laser beams to create a potential well where atoms may be cooled and trapped. Once the atoms are cooled and localized in space, the trapping potential can be shut off and the atoms can be interrogated and probed (using lasers, for example) to implement devices such as atomic clocks, magnetometers, and inertial sensors.

In one embodiment, an electro-permanent magnet unit may comprise what is referred to herein as a "hard" magnet in magnetic alignment with what is referred to herein as a "semi-hard" magnet. The terms "hard" and "semi-hard" with respect to magnets are well known to those of skill in the art of magnetics and generally refers to the coercivity ($H_c$) of the magnetic materials. High-coercivity magnetic materials are magnetized to saturation and experience a reversal in polarity in comparatively strong magnetic fields. Thus the magnetic hardness of the material at least in part represents how amenable the magnetic material is to having its polarity flipped by exposure to an externally applied magnetic field. This will be further explained below. A semi-hard magnet is one that has relatively less coercivity than a hard magnet, but greater than what would generally be considered a soft magnet. An example of a "hard" magnet material is NdFeB, and an example of a "semi-hard" magnet material is AlNiCo, but other magnetic materials can be used.

FIGS. 1 and 1A are a diagram illustrating generally at an electro-permanent (EP) magnet unit 101 of one embodiment of the present disclosure. FIG. 1 provides an exploded view of EP magnet unit 101 illustrating that comprises a first magnetic ring 110 and a second magnetic ring 120 that are positioned next to each other so that their center axes align to define a center axis 115 of EP magnet unit 101, and a coil of magnet wire 130 that is wrapped around the magnetic rings 110 and 120. As shown in FIG. 1A, when the elements of FIG. 1 are assembled, the first magnetic ring 110 and second magnetic ring 120 produce a net magnetic field aligned with the center axis 115 having a first pole (P1) extending from a first side of (EP) magnet unit 101 and a second pole (P2) extending from the opposite second side of (EP) magnet unit 101. As would be appreciated, P1 and P2 represent the opposing magnetic polarities associated with either side of the magnetic field produced by EP magnet unit 101. That is, when P1 is a north magnetic pole, then P2 is a south magnetic pole. Likewise, when P1 is a south magnetic pole, then P2 is a north magnetic pole. In this embodiment, the first magnetic ring 110 defines the "hard" magnet of the EP magnet unit 101 while the second magnetic ring 120 defines the "semi-hard" magnet In their initial states, each of the magnetic rings 110 and 120 comprise materials that exhibit a magnetic moment and each produce their own magnetic fields even when no current is applied to magnet wire 130. In one embodiment, when EP magnet unit 101 is in its initial state (also referred to herein as its "off" state), the magnetic rings 110 and 120 are arranged so that the same magnetic polarity from each of the magnetic rings 110 and 120 face each other. That is, in the off state, either the north pole of ring 110 faces the north pole of ring 120, or the south pole of ring 110 faces the south pole of ring 120. In this configuration, their respective magnetic fields produced by each magnetic ring offset so that the net magnetic field from unit 100 will have a magnitude that is a function of the difference between the magnitudes of their individual fields. In some embodiments, the dimensions, geometry and material used to fabricate the magnetic rings 110 and 120 are selected so that the magnetic fields completely, or almost completely offset each other when in the off state and EP magnet unit 101 produces a net magnetic field of essentially zero. The off state, where the respective fields of rings 110, 120 offset, is also referred to herein as the deactivated state of EP magnet unit 100.

In contrast to the off state, EP magnet unit 101 may also be set to a second state referred to herein as the "on" or "activated" state. To switch the EP magnet unit 101 from the off state to the on state, a pulse of electric current is passed through magnetic wire 130 so that the magnetic polarization vector of the second magnetic ring 120 (i.e., the semi-hard magnet) is flipped parallel to the polarization of magnetic ring 110. That is, the polarity of magnetic ring 120 is flipped so that dissimilar magnetic poles of ring 120 and ring 110 face each other. In this configuration, rather than offsetting each other, the two magnetic fields produced by the magnetic rings 110 and 120 are additive so that the net magnetic field from unit 100 will have a magnitude that is cumulative (i.e. a function of the sum of the magnitudes of their individual fields).

To once again deactivate EP magnet unit 101 from the on state back to the off state, another short pulse of current may be passed in through magnetic wire 130 in the opposite direction as the current applied to activate EP magnet unit 101. When such current is applied, the magnetic polarization vector of magnetic ring 120 is flipped anti-parallel to that of magnetic 110 so that their individual magnetic fields once again offset.

The pulse of current applied to flip the state of unit 100 may be on the order of a micro seconds to hundreds of microseconds and of sufficient magnitude to produce a magnetic field sufficient to flip the polarity of magnetic ring 120, but not sufficient to flip the polarity of magnetic ring 110. At the same time, the material selected for ring 120 is also selected to have sufficient magnetic coercivity that it will not flip polarity or become demagnetized in response to the magnetic field produced by magnetic ring 110. That is, magnetic ring 120 has sufficient magnetic hardness to resist flipping poles in response to the magnetic field from magnetic ring 110, but will flip in response to the magnetic field produced by magnetic wire 130 when a current is applied. Magnetic ring 110 has sufficient magnetic hardness to resist flipping poles in response to the magnetic field from magnetic ring 120 and resist flipping poles in response to the magnetic field from magnetic wire 130.

FIG. 1B provides example magnetization (M) verses applied magnetic field (H) hysteresis curves 190 and 192 that illustrate the characteristics of "hard" verses "semi-hard" magnetic materials. Generally speaking, the "hardness" of a magnetic material (i.e., its coercivity or the magnitude of an applied magnetic field necessary to cause the material to flip in polarity) is at least in part a function of the width of the material's hysteresis curve along the horizontal "applied magnetic field" (H) axis so that the relative hardness or semi-hardness of any two magnetic materials (as those term is used herein) can be evaluated by comparing the relative widths of their hysteresis curves at this axis. When a driving field (i.e., an applied magnetic field) sufficient to cause saturation magnetization is applied to a hard magnetic material (illustrated at 190), it will retain a fraction of the saturation field even when the driving field is removed. In comparison, when the same driving field sufficient to cause saturation magnetization is applied to a semi-hard magnetic material (illustrated at 192) it will retain a smaller fraction of the saturation field when the driving field is removed. As such, the semi-hard magnetic material is more amenable to reversing polarity in response to an externally applied magnetic field than a hard magnetic material because, at least in part, of the differences in the saturation fields present in the material after the externally applied magnetic field is removed.

Figure 2:
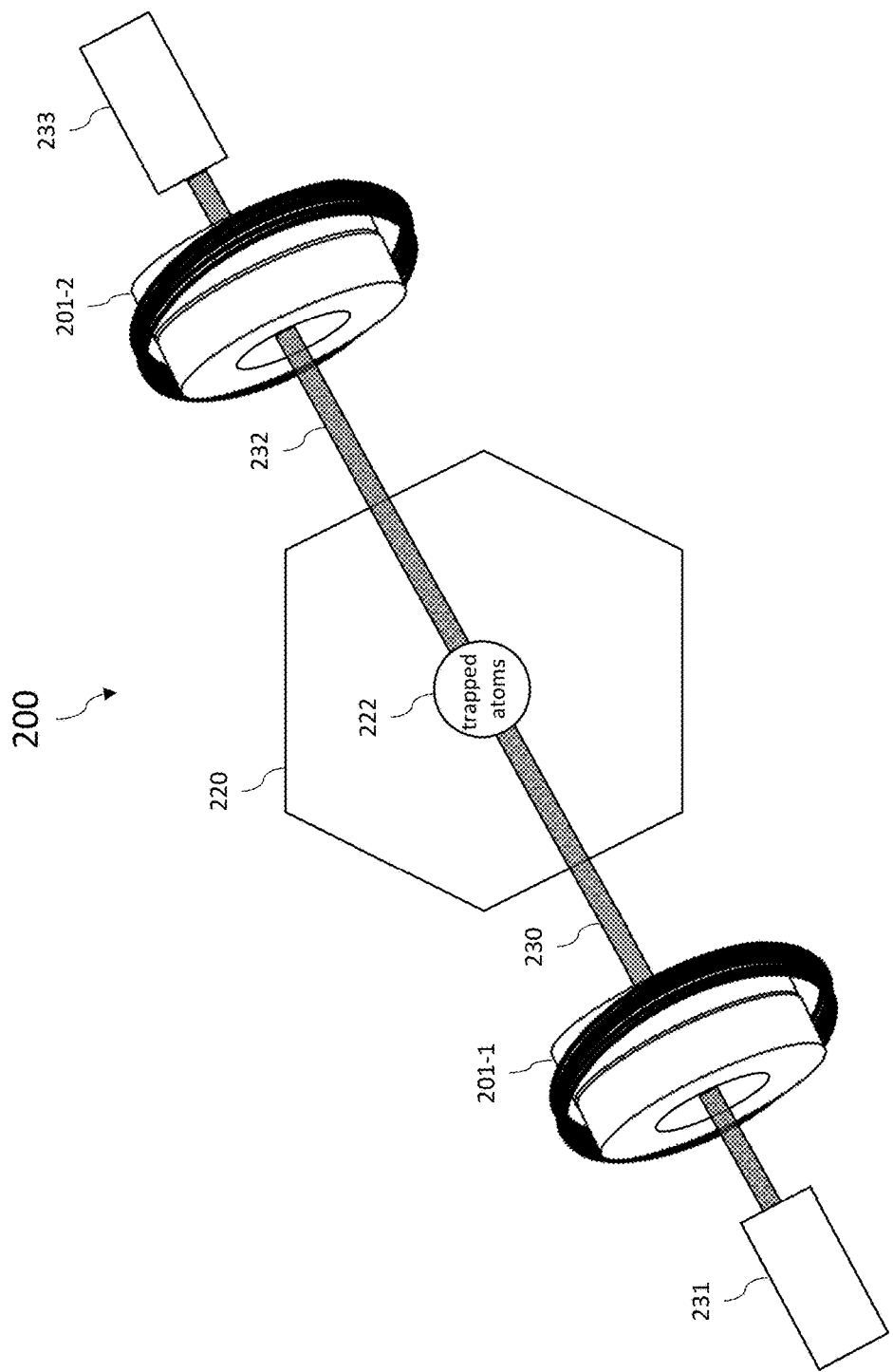

With cold atom sensors such a clocks or inertial sensors, an atom trapping field such as an anti-Helmholtz field is applied to trap atoms (such as, but not limited to atomic Rubidium (Rb), Cesium (Cs), calcium (Ca) or Ytterbium (Yb)) within a high vacuum chamber. FIG. 2 is a diagram illustrating such a cold atom sensor 200 comprising a set of paired EP magnet units 201-1 and 201-2, each of which having the structure and configuration as described above for EP magnet unit 101. As such, details from the above discussion regarding EP magnet unit 101 applies to each of the EP magnet units 201-1 and 201-2 and vice versa.

The EP magnet units 201-1 and 201-2 are positioned on opposite sides of an ultra-high vacuum cell or chamber 220 to introduce an atom trapping magnetic field (such as an anti-Helmholtz magnetic field or a quadrupole magnetic field) within the vacuum changer 220. That is, as further illustrated in FIG. 2A, the center axis of each of the two EP magnet units 201-1 (shown at 215-1) and 201-2 (shown at 215-2) are aligned to be co-linear with each other and with the center of a magneto-optical trap 222 defined within the vacuum chamber 220. Each of the two EP magnet units 201-1 and 201-2 are oriented with respect to magneto-optical trap 222 so that when they are both switched to the on state, the polarities of their respective magnetic fields are anti-parallel and offset each other at the very center of the magneto-optical trap 222 (i.e., their respective poles oriented in opposite directions) resulting in an atom trapping magnetic gradient 225 such as an anti-Helmholtz magnetic field configuration. For trapping to occur, the atoms are laser cooled by appropriately detuned laser beams 230, 232. The atom trapping magnetic field can be applied by switching EP magnet units 201-1 and 201-2 to the on state in order create the trapping potential 225, the minimum of which defines the center of the magneto-optical trap 222. As the term is used herein, a detuned laser beam refers to a laser tuned to a frequency slightly off from the natural atomic resonant frequency. Red-detuned light can provide a friction force to the atom whenever it moves towards a laser source, thereby slowing, or "cooling" the atom.

In the embodiment shown in FIG. 2, each of the detuned laser beams 230, 232 are generated by respective laser sources 231 and 233. Laser sources 231 and 233 are aligned with the center axis 115 of each of the respective EP magnet units 201-1 and 201-2 so that the laser beams 230, 232 pass through the center ring hole 112 of each and meet at the center of the trap 222. In this way, the laser beams 230, 232 are each aligned with the magnetic gradient produced in chamber 220 by the EP magnet units 201-1 and 201-2. It should also be appreciate that the laser sources 231 and 233, although shown as separate, will typically (but not always) be implemented using one single laser generating device such that laser beams 230, 232 are both derived from a single common laser beam.

To load cooled atoms into the spatially dependent trap 222, a pulse of current is applied to activate the EP magnet units 201-1 and 201-2 generating the atom trapping magnetic field gradient 225 that results in a net magnetic field of the anti-Helmholtz like configuration (i.e. at trap 222). More specifically, the atom trapping magnetic field 225 comprises a linear gradient that is zero at the very center of the trap 222 and increases in magnitude moving towards the EP magnet units 201-1 and 201-2. Because the atoms seek to rest at the point of lowest potential, they become trapped in the magneto-optical trap 222.

Although the atom trapping magnetic field in sensor 200 is applied to trap atoms, in order to characterize the atoms (for example, by interrogating and probing the internal states of the atoms), the magnetic field is momentarily de-energized. To de-energize the magnetic field providing the magnetic gradient, a current pulse is applied to each of the EP magnet units to turn their respective EP magnet units to the off state. The atoms can then be characterized by means known to those in the art. Once the characterization is completed, another current pulse is applied in the opposite direction to each of the EP magnet units to turn their respective EP magnet units to their on state and re-establish trap 222.

The EP magnet units described herein, unlike traditional electromagnetic coils, have the ability to remain magnetized once activated without using any power to maintain the magnetic field. By utilizing the EP magnet unit 101 shown in FIGS. 1 and 1A, embodiments of the present disclosure provide a low power and fast way to perform switching because each EP magnet unit only needs to be momentarily energized to switch the EP magnet units between on and off states, but the EP magnet units do not need to remain energized to maintain the anti-Helmholtz magnetic field.

One problem with the magnetic materials used to fabricate permanent magnets is that the magnetic field they generate may drift over time. For example, some magnetic materials are sensitive to temperature and will produce a magnetic field that changes as a function of changes in temperature. Therefore, for some embodiment, magnetic field biases may optionally be calibrated out of an EP magnet unit by measuring the internal state of the laser cooled atoms and translating those states into a feedback signal applied to the EP magnet unit. One such embodiment for mitigating drift is shown in FIG. 2B.

Figure 2A:
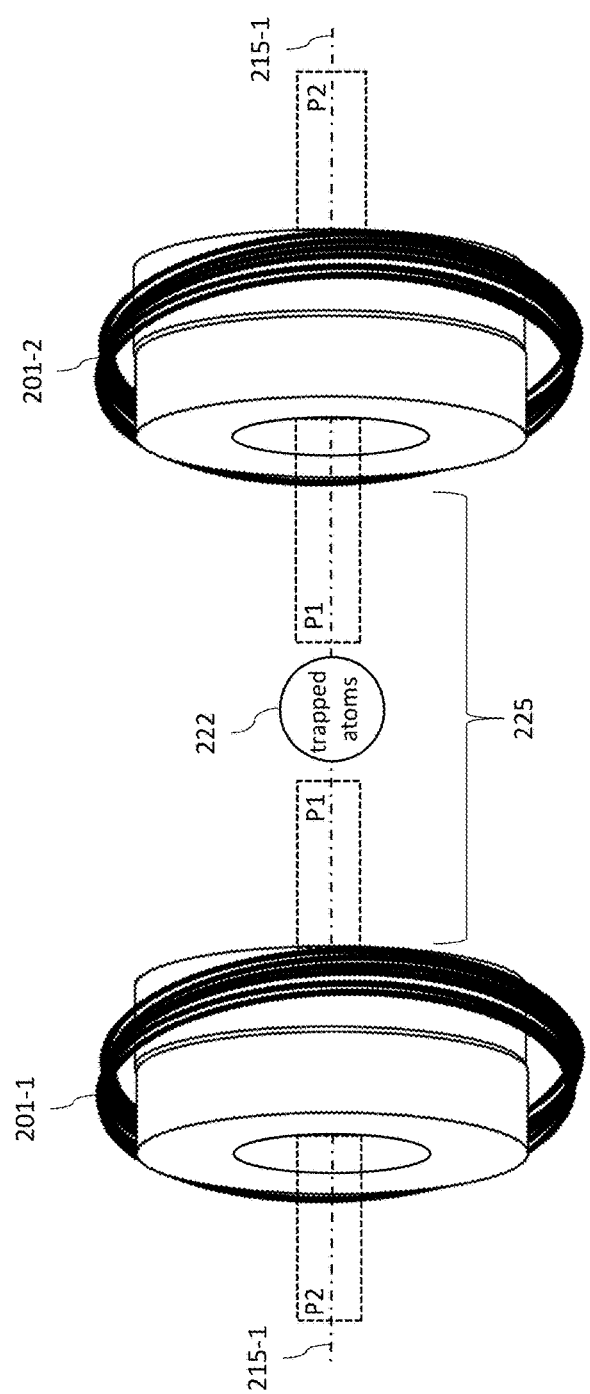
Figure 2B:
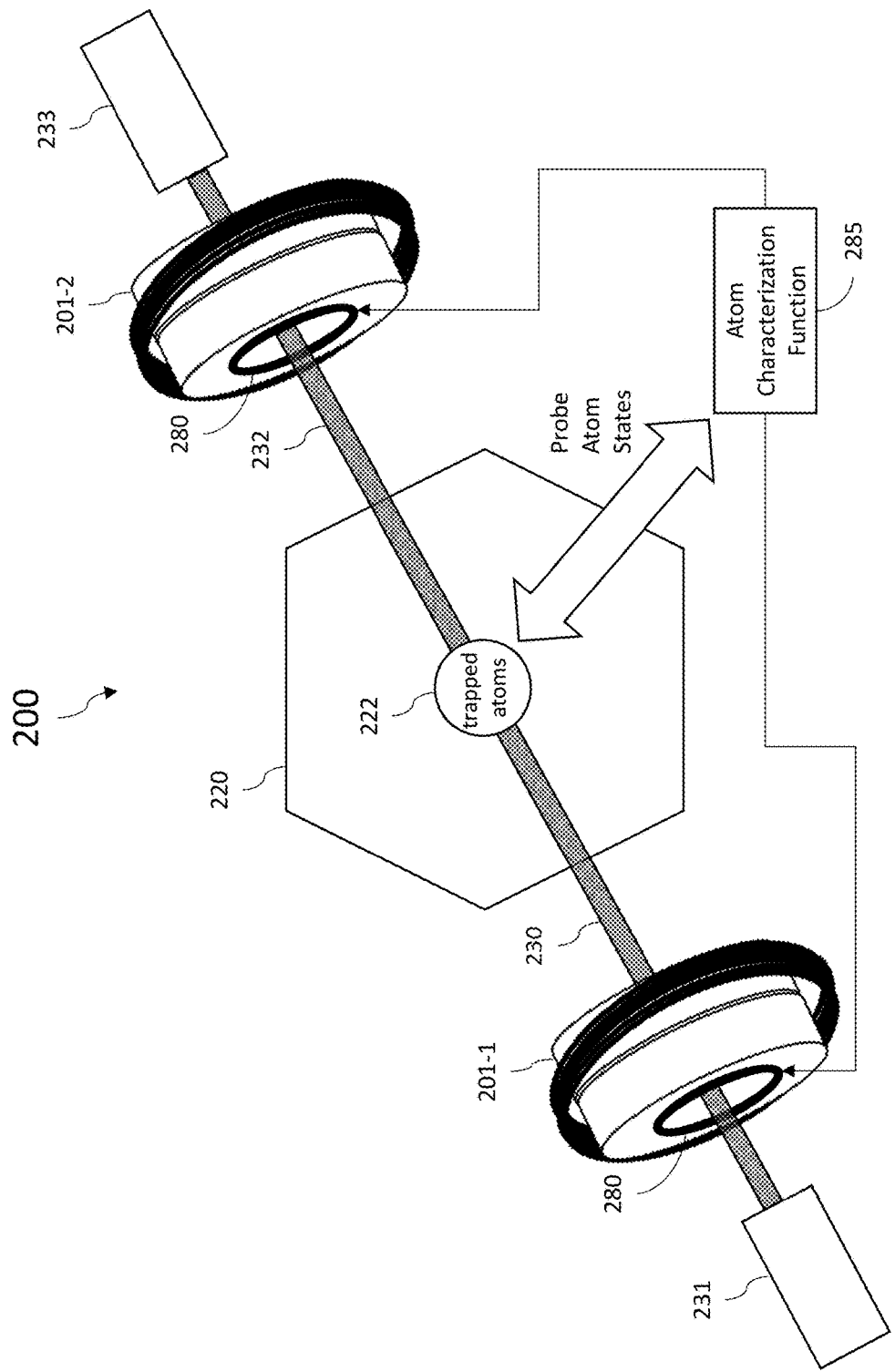

FIG. 2B is a diagram illustrating cold atom sensor 200 where each of the paired EP magnet units 201-1 and 201-2 further comprise shim coils 280. It should be appreciated that although shim coils 280 are discussed with respect to EP magnet units 201-1 and 201-2, they may also be utilized for other geometries as well. In one embodiment, shim coils 280 are low current carrying coils that can be utilized to compensate for any drift in the permanent magnet fields of EP magnet units 201-1 and 201-2 caused by temperature or other environmental effects. Shim coils 280 could also be used to further null any remnant magnetic field that may exist within trap 222 when the EP magnet units are in the off state. That is, even in the off state, the magnetic fields of the first magnetic ring 110 and second magnetic ring 120 may drift so that they do not perfectly offset which in the off state which means a low remnant magnetic field may remain present. By passing a current through shim coils 280, that low remnant magnetic field may be mitigated.

In one embodiment, cold atom sensor 200 further comprises an atom characterization function 285. The internal states of the laser cooled atoms are sensitive to the remnant magnetic field and may be probed, in the same manner as for a magnetometer, to determine the magnitude of any magnetic field acting on them. In one embodiment, active magnetic field nulling, using Zeeman state calibration or other methods, can be used in order to compensate for the field variations in time. For example, Zeeman spectroscopy can be used by atom characterization function 285 to probe the atomic state of the atoms in trap 222 to measure the remnant magnetic field. From that measurement, atom characterization function 285 generates a proportional current into one or both of shim coils 280 to produce a calibrating magnetic field that acts to null the remaining magnetic field. In one embodiment, periodic recalibration is performed using shim coils 280 to correct for magnetic drift that may occur over time. The current applied to shim coils 180 is essentially an error, or feedback, signal used to drive the magnetic field as measured in the atom trap 222 to zero when the magnetic field should be zero (i.e., when the EP magnet units 201-1 and 201-2 are in the off state).

It should be noted that in some alternate embodiments, the dimensions, geometry and material used for the magnetic rings 110 and 120 are selected to only partially offset in the off state so that there remains an intentional bias in the magnetic field around unit 101 even when unit 101 is deactivated. Such embodiments may be used in some clock applications. In such alternate embodiments, shim coils 280 may be utilized with atom characterization function 285 to calibrate an EP magnet unit to have the desired intentional offset in the off state, rather than a net magnetic field of zero.

It should be appreciated that although FIGS. 2, 2A and 2B illustrate utilization of one pair of laser beams which are aligned with the EP magnet units 201-1 and 201-2, magneto-optical trap 222 may in fact be implemented in all three Cartesian directions through additional laser beam pairs. For example, FIG. 2C illustrates the pair of laser beams 230 and 232 (shown at 260 produced by respective laser sources 231 and 233) used in conjunction with a second pair of laser beams 270 and 272 (shown at 262 produced by respective laser sources 271 and 273) and a third pair of laser beams 275 and 277 (shown at 264 produced by respective laser sources 276 and 278) each orthogonally oriented with respect to each other and having axes mutually intersecting at the center of magneto-optical trap 222.

Figure 3:
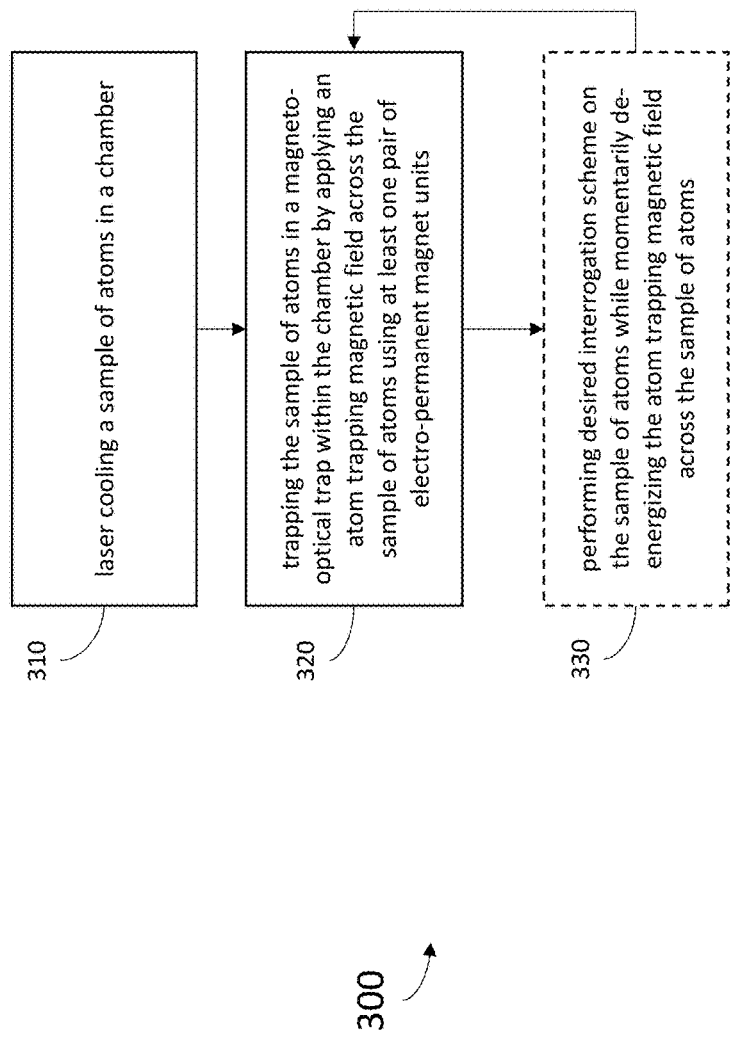
FIG. 3 is a flow chart illustrating a method of one embodiment of the present disclosure.

FIG. 3 is a flow chart illustrating a method 300 of one embodiment of the present disclosure for low power magnetic field generation for atomic sensors. In some embodiments, the elements of method 300 may be used to implement one or more elements of any of the embodiments described above with respect to the above Figures. As such, elements of method 300 may be used in conjunction with, or in combination with the embodiments described above and details from the above discussions apply to method apply to method 300 and vice versa.

The method begins at 310 with laser cooling a sample of atoms in a chamber. For trapping to occur, the atoms are laser cooled by appropriately detuned laser beams. The atom trapping magnetic field (such as an anti-Helmholtz magnetic field or a quadrupole magnetic field) is applied by switching the EP magnet units to the on state in order create a trapping potential gradient, the minimum of which defines the center of the magneto-optical trap.

Accordingly, the method proceeds to 320 with trapping the sample of atoms in a magneto-optical trap within the chamber by applying an atom trapping magnetic field across the sample of atoms using at least one pair of electro-permanent magnet units. As described above, each of the electro-permanent magnet units of the at least one pair of electro-permanent magnet units may comprise: a first magnetic ring of a first magnetic material, a second magnetic ring of a second magnetic material, and a coil of magnet wire that is wrapped around one or both of the first magnetic ring and the second magnetic ring. In that case, applying an anti-Helmholtz magnetic field, or other atom trapping magnetic field, across the sample of atoms further comprises applying a first pulse of current having a first duration and amplitude to the coil, wherein there first pulse of current switches each electro-permanent magnet unit from an off state to an on state by switching a magnetic polarity of the second magnetic ring without switching a polarity of the first magnetic ring. In other words, the first magnetic ring defines the "hard" magnet of the EP magnet unit while the second magnetic ring defines the "semi-hard" magnet. In the off state, a first magnetic field of the first magnetic ring and a second magnetic field of the second magnetic ring are oppositely polarized to offset each other in the same manner as describe above with respect to FIG. 1. Similarly, in the on state, the first magnetic field of the first magnetic ring and the second magnetic field of the second magnetic ring are similarly polarized to add to each other.

The atom trapping magnetic field is applied to trap atoms. But, in order to characterize the atoms (that is, probe the internal states of the atoms), the magnetic field is momentarily de-energized. As such in some embodiments, method 300 may proceed to 330 by performing a desired atomic interrogation scheme on the sample of atom while momentarily de-energizing the atom trapping magnetic field across the sample of atoms. This interrogation scheme may comprise probing an internal state of the atom sample, probing an external motional state of the atom sample, or some other atomic interrogation. In the manner described above, to de-energize the magnetic field providing the magnetic gradient, a second current pulse is applied (in the opposite direction of the first pulse) to each of the EP magnet units to turn their respective EP magnet units to their off state. The atoms can then be characterized by means known to those in the art. Once the characterization is completed, another current pulse is applied in the opposite direction to each of the EP magnet units to turn their respective EP magnet units to their on state and re-establish the magneto-optical trap.

Example Embodiments

Example 1 includes a method for magnetic field generation for an atomic sensor, the method comprising: laser cooling a sample of atoms in a chamber; and trapping the sample of atoms in a magneto-optical trap within the chamber by applying an atom trapping field across the sample of atoms using at least one pair of electro-permanent magnet units.

Example 2 includes the method of example 1, further comprising: performing an interrogation scheme on the sample of atoms while momentarily de-energizing the atom trapping magnetic field across the sample of atoms.

Example 3 includes the method of any of examples 1-2, wherein each electro-permanent magnet unit of the at least one pair of electro-permanent magnet units comprises: a first magnetic ring of a first magnetic material; a second magnetic ring of a second magnetic material; and a coil of magnet wire that is wrapped around one or both of the first magnetic ring and the second magnetic ring; wherein applying an atom trapping magnetic field across the sample of atoms further comprises applying a first pulse of current having a first duration and amplitude to the coil, wherein there first pulse of current switches each electro-permanent magnet unit from an off state to an on state by switching a magnetic polarity of the second magnetic ring without switching a polarity of the first magnetic ring.

Example 4 includes the method of example 3, wherein in the off state, a first magnetic field of the first magnetic ring and a second magnetic field of the second magnetic ring are oppositely polarized to offset each other, and wherein, in the on state, the first magnetic field of the first magnetic ring and the second magnetic field of the second magnetic ring are similarly polarized to add to each other.

Example 5 includes the method of any of examples 3-4, the first magnetic material having first magnetic hardness sufficient to not change polarity in response to the first pulse of current; and the second magnetic material having a second magnetic hardness less than the first magnetic material such that the second magnetic material will change polarity in response to the first pulse of current, but wherein the second magnetic hardness is sufficient to not change polarity in response to the first magnetic field of the first magnetic ring Example 6 includes the method of any of examples 1-5, wherein the least one pair of electro-permanent magnet units comprises a first electro-permanent magnet unit having a first center ring hole and a second electro-permanent magnet unit having a second center ring hole; wherein laser cooling further comprises: launching a first laser beam through the first center ring hole towards the second center ring hole, and launching a second laser beam through the second center ring hole towards the first center ring hold, wherein the first laser beam and the second laser beam are collinear and intersect at the magneto-optical trap.

Example 7 includes the method of any of examples 1-6, wherein laser cooling further comprises applying a first laser beam and a second laser beam into the magneto-optical trap each aligned to an axis of the anti-Helmholtz magnetic field.

Example 8 includes the method of any of examples 1-7, wherein the sample of atoms comprise one of atomic Rubidium (Rb), Cesium (Cs), atomic Calcium (Ca) or atomic Ytterbium (Yb).

Example 9 includes the method of any of examples 1-8, further comprising: probing the sample of atoms to measure a net magnetic field; and calibrating at least a first electro-permanent magnet unit of the at least one pair of electro-permanent magnet units based on the net magnetic field measured by the probing.

Example 10 includes the method of example 9, wherein the first electro-permanent magnet unit further comprising at least one shim coil; and wherein calibrating at least the first electro-permanent magnet unit comprises controlling a feedback current to the at least one shim coil based on the net magnetic field measured by the probing.

Example 11 includes a cold atom sensor, the sensor comprising: a vacuum chamber having a sample of atoms sealed within the vacuum chamber; at least one pair of electro-permanent magnet units arranged across the vacuum chamber, the least one pair of electro-permanent magnet units comprising a first electro-permanent magnet unit having a first center ring hole and a second electro-permanent magnet unit having a second center ring hole; a first laser source configured to launch a first laser beam through the first center ring hole and towards the second center ring hole, and a second laser source configured to launch a second laser beam through the second center ring hole and towards the first center ring hold, wherein the first laser beam and the second laser beam are collinear; wherein the first laser source and the second laser source are configured to laser cool the sample of atoms when the first laser beam and the second laser beam are energized and the first electro-permanent magnet unit and the second electro-permanent magnet unit are configured to produce an atom trapping magnetic field that holds the sample of atoms in an magneto-optical trap.

Example 12 includes the sensor of example 11, wherein each electro-permanent magnet unit of the at least one pair of electro-permanent magnet units comprises: a first magnetic ring of a first magnetic material; a second magnetic ring of a second magnetic material; and a coil of magnet wire that is wrapped around one or both of the first magnetic ring and the second magnetic ring; wherein the at least one pair of electro-permanent magnet units are configured to produce the atom trapping magnetic field across the sample of atoms by applying a first pulse of current having a first duration and amplitude to the coil, wherein there first pulse of current switches each electro-permanent magnet unit from an off state to an on state by switching a magnetic polarity of the second magnetic ring without switching a polarity of the first magnetic ring.

Example 13 includes the sensor of example 12, wherein the cold atom sensor is configured to perform interrogation on the sample of atoms while momentarily de-energizing the atom trapping magnetic field across the sample of atoms by switching a polarity of the second magnetic ring.

Example 14 includes the sensor of any of examples 12-13, wherein when switched to an off state, a first magnetic field of the first magnetic ring and a second magnetic field of the second magnetic ring are oppositely polarized to offset each other, and wherein when switched to an on state, the first magnetic field of the first magnetic ring and the second magnetic field of the second magnetic ring are similarly polarized to add to each other.

Example 15 includes the sensor of any of examples 12-14, the first magnetic material having first magnetic hardness sufficient to not change polarity in response to the first pulse of current; and the second magnetic material having a second magnetic hardness less than the first magnetic material such that the second magnetic material will change polarity in response to the first pulse of current, but wherein the second magnetic hardness is sufficient to not change polarity in response to the first magnetic field of the first magnetic ring Example 16 includes the sensor of any of examples 11-15, wherein first laser beam and the second laser beam are each aligned to an axis of the atom trapping magnetic field.

Example 17 includes the sensor of any of examples 11-16, wherein the sample of atoms comprise one of atomic Rubidium (Rb), Cesium (Cs), atomic Calcium (Ca) or atomic Ytterbium (Yb).

Example 18 includes the sensor of any of examples 11-17, further comprising: an atom characterization function configured to probe the sample of atoms to measure a net magnetic field; and wherein the atom characterization function is configured to calibrate at least a first electro-permanent magnet unit of the at least one pair of electro-permanent magnet units based on the net magnetic field measured by the probing.

Example 19 includes the sensor of any of examples 11-18, wherein the at least one of the pair of electro-permanent magnet units comprises a shim coil; and wherein the atom characterization function is configured to control a feedback current to the at least one shim coil based on the net magnetic field measured by the probing.

Example 20 includes the sensor of any of examples 11-19, wherein the at least one pair of electro-permanent magnet units comprise: a first pair of electro-permanent magnet units producing a first anti-Helmholtz magnetic field gradient across the magneto-optical trap.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of magnetic field generation with an atomic sensor, the method comprising:
   laser cooling a sample of atoms in a chamber; and
   trapping the sample of atoms in a magneto-optical trap within the chamber by applying an atom trapping field across the sample of atoms using at least one pair of electro-permanent magnet units;
   wherein each electro-permanent magnet unit of the at least one pair of electro-permanent magnet units comprises:
   a first magnetic ring of a first magnetic material;
   a second magnetic ring of a second magnetic material; and
   a coil of magnet wire that is wrapped around one or both of the first magnetic ring and the second magnetic ring;
   wherein applying an atom trapping magnetic field across the sample of atoms further comprises applying a first pulse of current having a first duration and amplitude to the coil of magnetic wire, wherein the applied first pulse of current also switches each electro permanent magnet unit of the at least one pair of electro-permanent magnet units from an off state to an on state by switching a magnetic polarity of the second magnetic ring without switching a polarity of the first magnetic ring.

2. The method of claim 1, further comprising:
   performing an atomic interrogation scheme on the sample of atoms while momentarily de-energizing the atom trapping magnetic field across the sample of atoms.

3. The method of claim 1, wherein the sample of atoms comprises one of atomic Rubidium (Rb), Cesium (Cs), atomic Calcium (Ca) or atomic Ytterbium (Yb).

4. The method of claim 1, wherein in the off state, a first magnetic field of the first magnetic ring and a second magnetic field of the second magnetic ring are oppositely polarized in order to offset each other, and
wherein, in the on state, the first magnetic field of the first magnetic ring and the second magnetic field of the second magnetic ring are similarly polarized in order to add to each other.

5. The method of claim 1, the first magnetic material having a first magnetic hardness sufficient to not change polarity in response to the first pulse of current; and
the second magnetic material having a second magnetic hardness that is less than the magnetic hardness of the first magnetic material such that the second magnetic material will change its polarity in response to the first pulse of current, but wherein the second magnetic material has a hardness that is sufficient in order to not change polarity in response to the first magnetic pulse of current applied to the first magnetic ring.

6. The method of claim 1, wherein the least one pair of electro-permanent magnet units comprises a first electro-permanent magnet unit having a first center ring hole and a second electro-permanent magnet unit having a second center ring hole;
wherein the laser cooling further comprises:
launching a first laser beam provided by a first laser source through the first center ring hole towards the second center ring hole, and
launching a second laser beam provided by a second laser source through the second center ring hole towards the first center ring hold, wherein the first laser beam and the second laser beam are collinear with one another and intersect at the magneto-optical trap.

7. The method of claim 1, wherein laser cooling further comprises applying a first laser beam and a second laser beam into the magneto-optical trap with each laser beam being aligned to an axis of an anti-Helmholtz magnetic field.

8. The method of claim 1, further comprising:
probing the sample of atoms in order to measure a net magnetic field; and
calibrating at least a first electro-permanent magnet unit of the at least one pair of electro-permanent magnet units based on the net magnetic field measured by the probing.

9. The method of claim 8, wherein the first electro-permanent magnet unit further comprising: at least one shim coil; and wherein calibrating at least the first electro-permanent magnet unit comprises controlling a feedback current to the at least one shim coil based on the net magnetic field measured by the probing.

10. A cold atom sensor, the cold atom sensor comprising:
a vacuum chamber having a sample of atoms sealed within the vacuum chamber;
at least one pair of electro-permanent magnet units arranged across the vacuum chamber, the least one pair of electro-permanent magnet units comprising a first electro-permanent magnet unit having a first center ring hole and a second electro-permanent magnet unit having a second center ring hole;
a first laser source configured to launch a first laser beam through the first center ring hole and towards the second center ring hole, and a second laser source configured to launch a second laser beam through the second center ring hole and towards the first center ring hold, wherein the first laser beam and the second laser beam are collinear;
wherein the first laser source and the second laser source are configured to laser cool the sample of atoms when the first laser beam and the second laser beam are energized and the first electro-permanent magnet unit and the second electro-permanent magnet unit are configured to produce an atom trapping magnetic field that holds the sample of atoms in an magneto-optical trap;
wherein each electro-permanent magnet unit of the at least one pair of electro-permanent magnet units comprises:
a first magnetic ring of a first magnetic material;
a second magnetic ring of a second magnetic material; and
a coil of magnet wire that is wrapped around one or both of the first magnetic ring and the second magnetic ring;
wherein the at least one pair of electro-permanent magnet units are configured to produce the atom trapping magnetic field across the sample of atoms by applying a first pulse of current having a first duration and amplitude to the coil of magnetic wire, wherein the applied first pulse of current also switches each electro-permanent magnet unit of the at least one pair of electro-permanent magnet units from an off state to an on state by switching a magnetic polarity of the second magnetic ring without switching a polarity of the first magnetic ring.

11. The cold atom sensor of claim 10, wherein the cold atom sensor is configured to perform an atomic interrogation on the sample of atoms while momentarily de-energizing the atom trapping magnetic field across the sample of atoms by switching a polarity of the second magnetic ring.

12. The cold atom sensor of claim 10, wherein when switched to an off state, a first magnetic field of the first magnetic ring and a second magnetic field of the second magnetic ring are oppositely polarized in order to offset each other, and
wherein when switched to an on state, the first magnetic field of the first magnetic ring and the second magnetic field of the second magnetic ring are similarly polarized in order to add to each other.

13. The cold atom sensor of claim 10, the first magnetic material having first magnetic hardness sufficient to not change polarity in response to the first pulse of current; and
the second magnetic material having a second magnetic hardness that is less than the magnetic hardness of the first magnetic material such that the second magnetic material will change its polarity in response to the first pulse of current, but wherein the second magnetic material has a hardness that is sufficient hi order to not change polarity in response to the first magnetic pulse of current applied to the first magnetic ring.

14. The cold atom sensor of now, wherein the first laser beam and the second laser beam are each aligned to an axis of the atom trapping magnetic field.

15. The cold atom sensor of claim 10, wherein the sample of atoms comprise one of atomic Rubidium (Rb), Cesium (Cs), atomic Calcium (Ca) or atomic Ytterbium (Yb).

16. The cold atom sensor of claim 10, further comprising:
an atom characterization function configured to probe the sample of atoms in order to measure a net magnetic field; and
wherein the atom characterization function is configured to calibrate at least a first electro-permanent magnet unit of the at least one pair of electro-permanent magnet units based on the net magnetic field measured by the probing performed by the atom characterization function.

17. The cold atom sensor of claim 16, wherein the at least one of the pair of electro-permanent magnet units comprises a shim coil; and wherein the atom characterization function is configured to control a feedback current supplied to the at least one shim coil based on the net magnetic field measured by the probing performed by the atom characterization function.

18. The cold atom sensor of claim 10, wherein the at least one pair of electro-permanent magnet units comprise: a first pair of electro-permanent magnet units producing a first anti-Helmholtz magnetic field gradient across the magneto-optical trap.

* * * * *